United States Patent
Carr (10) Patent No.: US 6,774,693 B2
(45) Date of Patent: *Aug. 10, 2004

(54) DIGITAL DELAY LINE WITH SYNCHRONOUS CONTROL

(75) Inventor: Larrie Carr, Burnaby (CA)

(73) Assignee: PMC-Sierra, Inc. (CA)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 532 days.

(21) Appl. No.: 09/484,248

(22) Filed: Jan. 18, 2000

(65) Prior Publication Data

US 2001/0050585 A1 Dec. 13, 2001

(51) Int. Cl.[7] .............................................. H03H 11/26
(52) U.S. Cl. ...................................... 327/276; 327/158
(58) Field of Search ............................... 327/261, 263, 327/276, 277, 278, 284, 149, 153, 158, 164, 407, 159

(56) References Cited

U.S. PATENT DOCUMENTS

| | | | | |
|---|---|---|---|---|
| 4,789,996 A | * | 12/1988 | Butcher ....................... | 375/120 |
| 5,045,714 A | * | 9/1991 | Park et al. ................... | 326/104 |
| 5,796,288 A | * | 8/1998 | Krech, Jr. et al. .......... | 327/407 |
| 5,940,414 A | * | 8/1999 | Takano et al. ............. | 371/22.5 |
| 6,028,462 A | * | 2/2000 | Kyles ......................... | 327/277 |

* cited by examiner

Primary Examiner—Quan Tra
(74) Attorney, Agent, or Firm—Hall, Myers, Vande Sande & Pequignot

(57) ABSTRACT

A digital delay line, which includes a plurality of multiplexer delay elements, arranged in sequence with each of the plurality of multiplexer delay elements having an associated control input. A clock signal line is coupled to a clock input of each of the plurality of multiplexers and is operative to provide synchronous, phase aligned clock signals from a clock signal source to each of said clock inputs. A control input is coupled to each of the plurality of multiplexer delay elements and is operative to transmit to each of the plurality of multiplexer delay elements an associated control signal. In response to a first change in the control signal an associated delay element is added to the delay line and in response to a second change the delay element is removed from the delay line.

4 Claims, 8 Drawing Sheets

Figure 1 - Traditional Clocking Structure

PRIOR ART

Figure 2 - Traditional Clocking Timing

PRIOR ART

Figure 3    - Compensated Clocking Structure

PRIOR ART

Figure 4    - Compensated Clocking Timing

PRIOR ART

Figure 5    - Delay Locked Loop

PRIOR ART

Figure 6    - Delay Line using Buffer Chain

PRIOR ART

Figure 7 - Delay Line using Current Starved Buffers

PRIOR ART

Figure 8 - Basic Delay Line Architecture

Figure 9 - Multiplexer Implementation

Figure 10 - Delay Chain Structure

Figure 11    - Multiple UI Jump Point Determination

Figure 12    - Jump Point Timing

DIGITAL DELAY LINE WITH SYNCHRONOUS CONTROL

FIELD

The present invention relates to a digital delay line structure with a synchronous single clock domain control.

BACKGROUND

Figure 1:
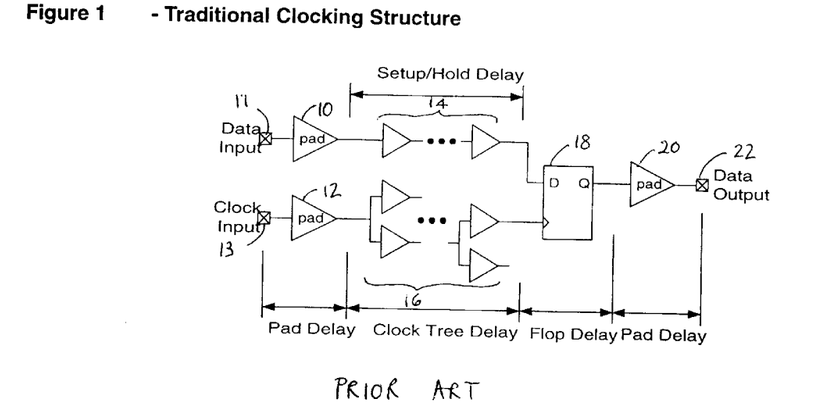
FIG. 1 is a schematic diagram of a traditional clocking structure.

In order to illustrate why a digital delay line is required in a device, an example of the traditional clocking methods is provided. FIG. 1 shows a simplified schematic of a device using clock tree synthesis. Data is input on pin 11 while clock signals are input on pin 13. The input signal is applied to pad 10 while the clock input is applied to pad 12. The set-up and hold delay is represented by circuit elements 14 which are applied to the D input of the flip-flop 18. The clock tree 16 has an output which is applied to the other input of the flip-flop 18. For devices using super-clock buffers, the clock tree may be replaced with the super clock buffers. Test logic such as boundary scan has not been considered in this analysis, but may be lumped into the modeled delays.

Figure 2:
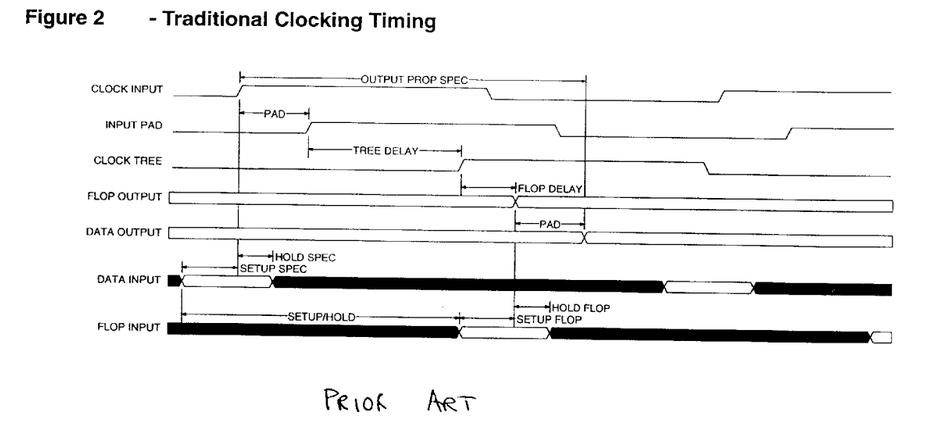
FIG. 2 is a timing diagram for the circuit of FIG. 1.

The lumped delays in FIG. 1 are analyzed to show the effect of the clock tree. As shown by the timing diagram of FIG. 2, the output propagation delay is determined by the input pad delay, the clock tree delay, the flop propagation delay and the output pad delay. For large designs where the clock tree delay is over 4 or 5 ns, the clock tree will dominate the output propagation delay. While custom clock trees, such as using a separate clock tree to the output flip-flop/flops, may help the problem, the tree may still be big enough to significantly affect the output propagation delay.

Since the clock tree delays the clock to the flip-flop sampling the input data, the input data must also be delayed in order to achieve reasonable input setup and hold performance. The delay may be test or functional logic or may be delay chains formed using a string of buffers. In some cases, the propagation difference between a clock input pad and a data input pad requires the input data setup and hold specifications to vary significantly over process voltage and temperature as precise matching of the delays is impossible.

As devices increase in complexity, the clock tree increases in size and latency. While the input setup and hold specifications can be adjusted by increasing the delay on the data inputs, the output propagation delay increases. For extremely large devices with thousands of flip-flops, the clock tree delay may prevent reasonable output propagation delays for high-speed interfaces (for example, the SUNI-622 device manufactured by PMC-Sierra, Inc. of Burnaby, B.C., Canada has an interface with an output propagation close to the clock period). One solution is to use a custom clock tree with high-speed output flip-flops operating on a separate small clock tree. While this solution has been used (for example, in the SUNI-QJET also manufactured by PMC-Sierra, Inc.), devices with a large number of high-speed output flip-flops will still have problems with clock tree latency.

Figure 3:
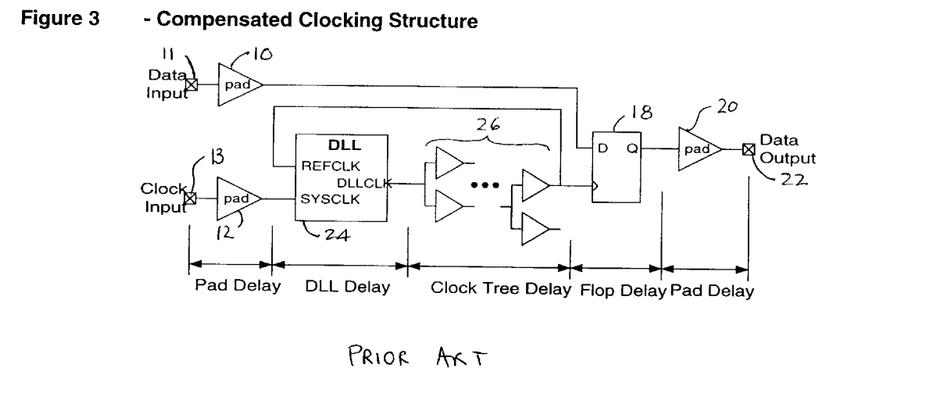
FIG. 3 is a circuit diagram which includes a digital delay locked loop.
Figure 4:
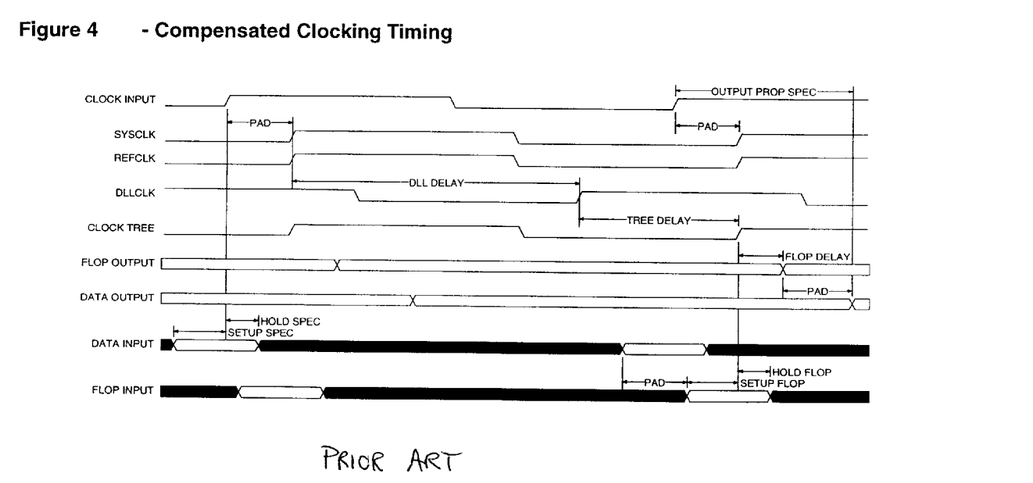
FIG. 4 is a timing diagram for the circuit of FIG. 3.

One solution is to use a digital delay locked loop (DLL) 24 as seen in FIG. 3. In this case the DLL 24 has a SYSCLK input coupled to an output of the clock input pad 12 and a REFCLK (reference clock) input taken from an output of clock tree 26 which is also applied to the input to flip-flop 18. The DLL generates an internal clock DLLCLK based on the incoming SYSCLK clock input. Since the REFCLK input is connected to the output of the clock tree, the DLLCLK clock output is adjusted until the SYSCLK input and the REFCLK input align. As shown in the timing diagram in FIG. 4 a rising edge from the clock tree 26 coincides with the rising edge of SYSCLK from the clock input pad 12. The output propagation specification is now comprised of the clock input pad delay, the flop delay, the output pad delay and the DLL clock uncertainty.

Figure 5:
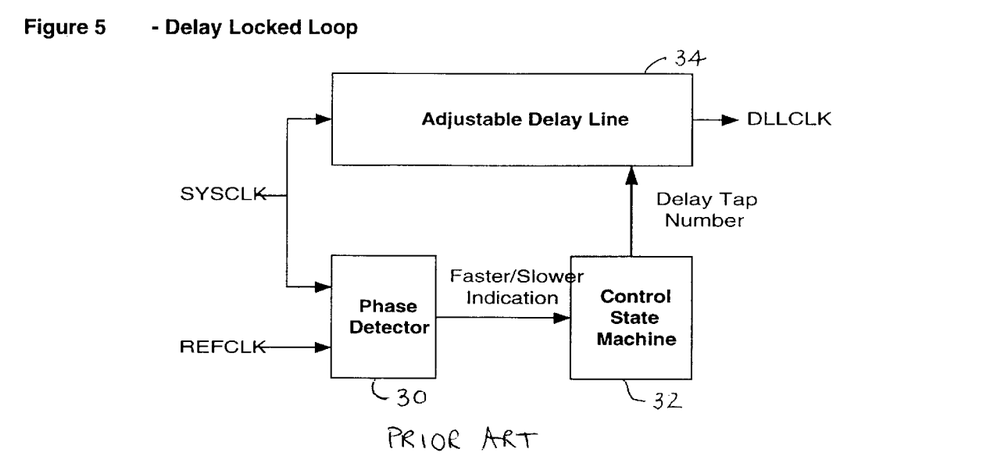
FIG. 5 is a schematic diagram of an adjustable delay locked loop delay line.

A digital delay locked loop architecture is shown in FIG. 5. In this case the SYSCLK input is coupled to an adjustable delay line 34 and to a phase detector 30. Phase detector 30 also has a REFCLK input. The output of the phase detector 30 is directed to a control state machine 32 which directs the amount of delay to be implemented by adjustable delay line 34 in response to the phase difference between SYSCLK and REFCLK. Since the output clock DLLCLK is the same frequency as the system clock SYSCLK, the DLLCLK may be a phase delayed version of the SYSCLK input. A variable delay line controlled by the phase detector produces the required delay to generate the DLLCLK. The control state machine performs many tasks such as filtering the phase detector information and producing status/error control signals for monitoring purposes.

Figure 6:
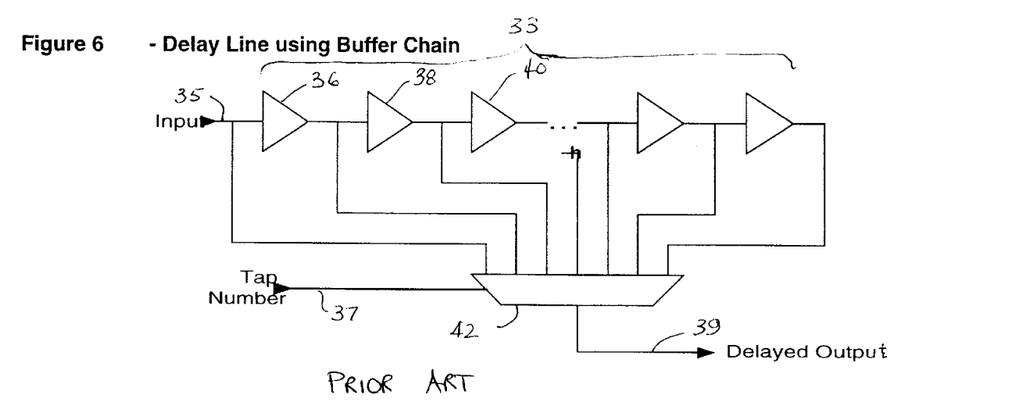
FIG. 6 is a schematic diagram of a delay line using a buffer chain.

An adjustable delay line has been implemented in many ways. One way is shown in FIG. 6 in which a chain 33 of buffers 36, 38, 40, etc. forms the delay line with taps taken from the input and at the output of each of the buffers 36, 38, 40, etc. The buffers 36, 38, 40, etc. provide a series of phase delayed copies of the input clock. An output multiplexer 42 selects the desired phase delay from the buffer chain 33. While the chain 33 of buffers 36, 38, 40, etc. may be easily implemented, the multiplexer 42 is very hard to design as the multiplexer 42 must be able to switch between two clock phases without the output changing at a time that is synchronous with the input clock but with unknown phase delay from the input clock (hereinafter referred to as "glitching"). Most multiplexer implementations use either AND-OR tree logic or pass transistor logic. However, the phase selection must be changed with specific timing in order not to cause a glitch in the output. Usually, local control of the multiplexing function (e.g. a D flip-flop and control logic) is required for each buffer 36, 38, 40, etc. or group of buffers to ensure the output clock does not glitch.

Figure 7:
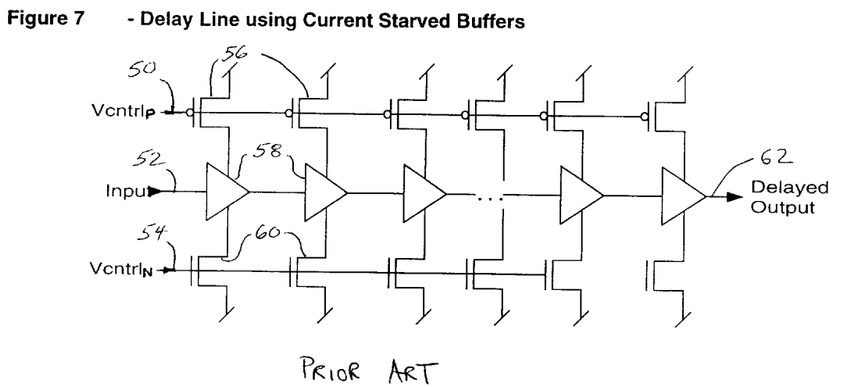
FIG. 7 is a schematic diagram of a delay line using current starved buffers.

Another common method of implementing a delay line is shown in FIG. 7. In this case series connected buffers 58 each have a PMOS FET 56 and an NMOS FET 60 in their power supply circuits. The current through PMOS FETs 56 are controlled by a voltage Vcntrl$_P$ on input 50 and through the NMOS FETs 60 by a related voltage Vcontrl$_N$ on input line 54. In this case, the delay of the delay line is adjusted using control currents into the respective buffers 58. By limiting the current the buffers can draw from the power supply, the delay through the buffer is related to the control current and the capacitance on the buffer's output. While this implementation is very elegant, it requires some analog design for the current mirrors and control voltage generation. While it does not allow for delay jumping, the analog control voltages allow for very precise delay control.

Many other implementations of delay lines exist, but such implementations tend to contain a combination of elements of FIG. 6 and FIG. 7. For example, an implementation may use the analog delay line in FIG. 7, but tune the total delay through the chain to be one clock period. This will produce N equally spaced clock phases, one for each delay stage, which can be selected using the multiplexer in FIG. 6. Another example may use multiple stages of the delay line in FIG. 6 to produce a delay line with coarse and fine adjustment control buses.

Most digital approaches seen in publications have a basic structure: the input of the delay line with one clock phase, the output of the delay line with another phase and the control with a third phase. The problem with such an architecture is that three clock domains exist (input, output and control) with the same frequency, but with different phase offsets. In reality, only the input clock domain is important as it controls all logic. All other clock domains are derived (such as the output clock domain) or artificial (such as the control clock domain). There is a need for reduction of the number of clock domains to two.

Accordingly, it is an object of the invention to provide a delay line that is easily controlled using a digital control bus updated at a constant and known phase offset, preferably zero, to the controlling state machine clock and input clock.

It is a further object of the invention to provide a delay line which can be constructed using standard ASIC library elements. It is yet another object of the invention to provide a delay line which is not sensitive to the library cells' asymmetric drive strengths and takes advantage of digital ASIC design flows such as clock tree synthesis and digital place and route layout automation.

Another object of the invention is to provide a delay line which is relatively insensitive to the layout of the logic on the chip. Using clock tree synthesis to provide a global clock to all logic in the delay line would provide such insensitivity.

Finally it is a further object of the invention to provide a delay line implementation which allows multiple clock period movement to be performed (useful for data recovery type functions).

SUMMARY OF THE INVENTION

According to the invention there is provided a digital delay line, which includes a plurality of multiplexer delay elements, arranged in sequence with each of the plurality of multiplexer delay elements having an associated control input. A clock signal line is coupled to a clock input of each of the plurality of multiplexers and is operative to provide synchronous, phase aligned clock signals from a clock signal source to each of said clock inputs. A control input is coupled to each of the plurality of multiplexer delay elements and is operative to transmit to each of the plurality of multiplexer delay elements an associated control signal. In response to a first change in the control signal an associated delay element is added to a start of the delay line and in response to a second change the delay element is removed from a start of the delay line.

A phase detector may be coupled to an input of a selected delay element in the delay line, and be operative to indicate when an input clock has the same phase as a delay input signal after having passed through the delay elements positioned prior to the selected delay element.

Each multiplexer may have two gates, each with two inputs, a signal input of the inputs to each of the input gates coupled to a signal source, an output of each of the input gates coupled to respective inputs of an output gate, and a logic circuit having an input coupled to a multiplexer select input and an output coupled to the signal inputs of the two input gates. The logic circuit may be operative to cause the multiplexer to select one of the signal inputs when the multiplexer select input is low and to select another of the inputs when the multiplexer select input is high.

Preferably, each of the gates is selected from the group consisting of a NAND gate and a NOR gate.

The logic circuit may include a multiplexer select NAND gate having a multiplexer select input and a fixed input held high, a mux NAND gate having one input coupled to an output of the multiplexer select NAND gate and also to an input of one of the two input NAND gates. An output of the mux NAND gate may be coupled to an input of another of the two input NAND gates.

A clock tree may be coupled to a clock source and be operative to provide clock signals to the plurality of multiplexer delay elements.

A driver may be coupled to a multiplexer select input of the multiplexer select NAND gate of each of the multiplexers and a control bus coupled to an input of the driver.

Advantageously, the driver may be a flip-flop circuit.

The phase detector may be coupled across clock and signal inputs to a last one of the delay elements in the digital delay line.

In another aspect of the invention there is provided a method of establishing a digital delay line, comprising forming a sequence of digital delay elements, coupling a control bus to each of the delay elements, control signals on the control bus being operative to control the insertion or deletion of associated delay elements from a start of the delay line. An input clock may be coupled to each of the digital delay elements by using an input clock bus. The delay elements may be inserted or deleted at the input side of the sequence of delay elements.

Preferably, the digital delay elements are multiplexers, each formed from a combination of logic gates.

BRIEF DESCRIPTION OF THE DRAWINGS

Further features and advantages will be apparent from the following detailed description, given by way of example, of a preferred embodiment taken in conjunction with the accompanying drawings, wherein.

DETAILED DESCRIPTION WITH REFERENCE TO THE DRAWINGS

In the following description like numbers correspond to like parts. In the embodiment of FIG. 6, delay is added to the end of the delay line in order to increase the delay. In such a configuration, it is necessary to add or subtract delay on a control clock domain, which generally has a phase offset that is different than that of the input clock domain.

Figure 8:
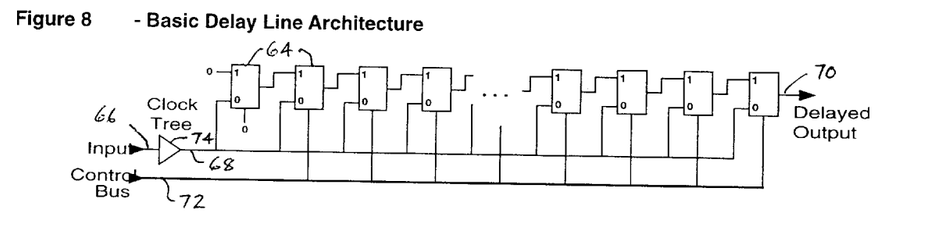
FIG. 8 is a schematic diagram of a basic delay line architecture.

Referring to FIG. 8, the delay line can be pictured as a train where the delay is added to the beginning of the train to increase the delay between the start and the end of the train. The elegance of this solution is that the adding or subtracting of the delays may be performed on the same clock domain as the input clock. Thus, the control bus signals will be driven by a flip-flop running on the same clock tree as the multiplexers.

The pattern on the control bus determines the length of the delay line. Multiplexer select inputs on the right of the clock insertion point must be set to logic 1. The multiplexer select input at the clock insertion point and to the right of the point must be set to logic 0. Thus, the pattern on the control bus is a 0000 . . . 00001111 . . . 1111 value. To increase the delay (add another multiplexer), the control bus will see its pattern change to a 0000 . . . 00011111 . . . 1111 value. To decrease the delay (remove a multiplexer), the control bus will see its pattern change to a 0000 . . . 00000111 . . . 1111 value. Therefore, only one bit must change in the control bus to change the delay, unlike the traditional multiplexing shown in FIG. 6.

Referring to FIG. 8, the implementation of the basic delay line architecture uses multiplexers 64 to add or subtract each delay element. In order to keep the delay of each stage to a minimum, the multiplexer 64 implements both the multiplexing function and the delay. Thus, the length of the delay line is determined by the number of multiplexers 64 between the clock input 68 and the output 70 plus the delay through the clock tree 74. In order to prevent clock duty cycle distortion, the multiplexer 64 must be designed with balance delays (same delay through the multiplexer 64 when the output transitions from logic 1 to logic 0 and when it transitions from logic 0 to logic 1). However, standard cells usually do not have balance delay paths requiring careful design of the multiplexer 64.

Figure 9:
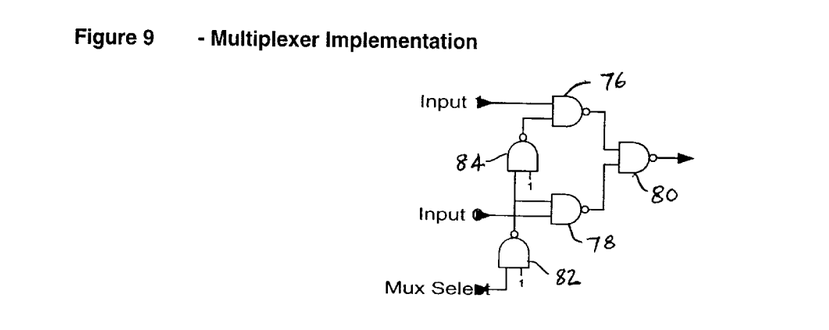
FIG. 9 is a circuit diagram of a multiplexer implemented with NAND gates.

An implementation of the multiplexer 64 is shown in FIG. 9 as consisting of the two inputs coupled to respective inputs of NAND gates 76 and 78 with the output of each NAND gate 76 and 78 connected to an associated input of NAND gate 80. A multiplexer select input is applied to one input of NAND gate 82 an output of which couples to both an input of NAND gate 84 and NAND gate 78. The other inputs of NAND gates 82 and 84 are held at "1". Thus, when the multiplexer select input goes high, the output of NAND gate 82 goes low causing the output of NAND gates 78 and 84 to go high. If the input to NAND gate 76 goes high, its output goes low, causing the output of NAND gate 80 to go high. If the input to NAND gate 76 goes low, then the output of NAND gate 76 goes high causing the output of NAND gate 80 to go low. In order to produce balance delay paths, the multiplexer 64 is designed using 2-input NAND gates with each delay path composed of two gate delays. Each path inverts a data transition twice so that the resulting delay is the sum of the smallest gate delay and the largest gate delay. The ordering of the gate inputs is important to ensure the delay paths are balanced. The fan-out of the NAND gates is limited to one gate input. High drive strength is used to reduce the effect of layout capacitance and make the design insensitive to layout.

Figure 10:
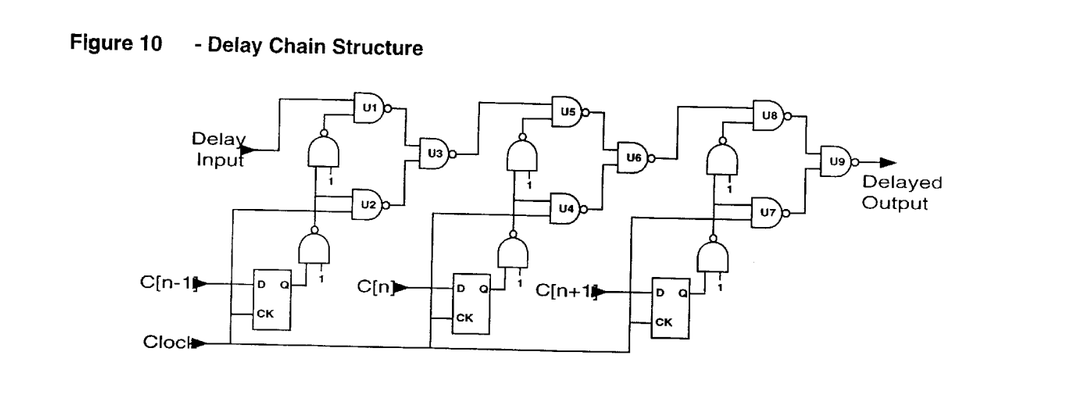
FIG. 10 is a circuit diagram of a delay chain structure employing the multiplexers of FIG. 9.

The key design constraint is that the multiplexer select input must change value only when both multiplexer inputs are the same logic value. It is only then that the output is insensitive to a change in multiplexer select input. For the circuit of FIG. 9, input 78 is selected when the multiplexer select input is low, and input 76 is selected when the multiplexer select input is high. For the NAND multiplexer implementation, the select input controls the two NAND gates 76 and 78, which squelch or pass the incoming multiplexer inputs. The multiplexer uses the same NAND gates to invert the select input in order to provide timing margin to the multiplexing function. Shown in FIG. 10 is an example of three middle stages of a delay line with their associated control flip-flops. In this example, the C[n−1] value is logic 0 and the C[n] and C[n+1] are logic 1.

To decrease the delay, the C[n] value must change from logic 0 to logic 1. On the rising edge of the clock, the C[n] select input to the multiplexer changes. Gate U5 will see the change in select value one flop delay and two NAND delays after the rising edge (through the inverting NAND gates). The other input of gate U5 will see the rising edge of the clock two NAND delay after the rising edge (through gates U2 and U3). The timing margin for U5 is a flop delay. Gate U4 will see the select value change one flop delay and one NAND delay after the rising edge. The margin for U4 is a flop delay and NAND delay.

Thus, all clocks in the design are synchronous and have the same phase. They can be supplied by a layout tool generated clock tree, which will have almost zero clock skew between the end points of the tree. The key with clock tree generation is that the layout tool balances clock tree delay to non-buffer standard cell elements. This means a NAND gate acts as a clock tree end point in the same way a flip-flop clock input acts as an end point.

Figure 11:
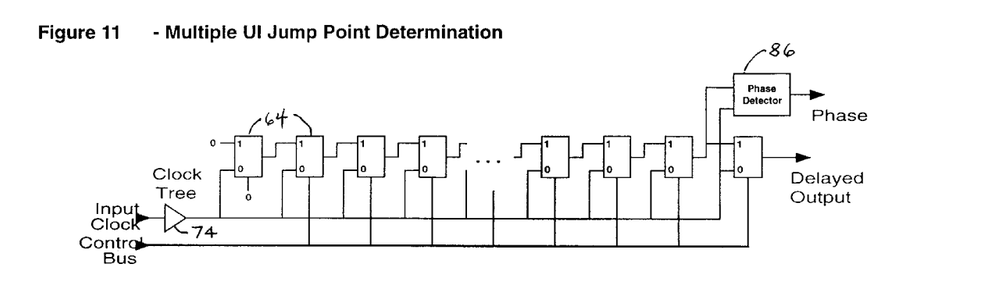
FIG. 11 is a circuit diagram of a plurality of multiplexers with a phase detector added to determine jump point.

The delay line can handle multiple clock periods of phase correction by either using a very large delay line or by jumping from one end of the delay line to the other. While the delay of each multiplexer 64 will change due to process, temperature and voltage, the jump point can be found by monitoring the delay through the delay line and finding the appropriate delay element. FIG. 11 shows how a phase detector 86 may be added to the delay line to determine the jump point.

Figure 12:
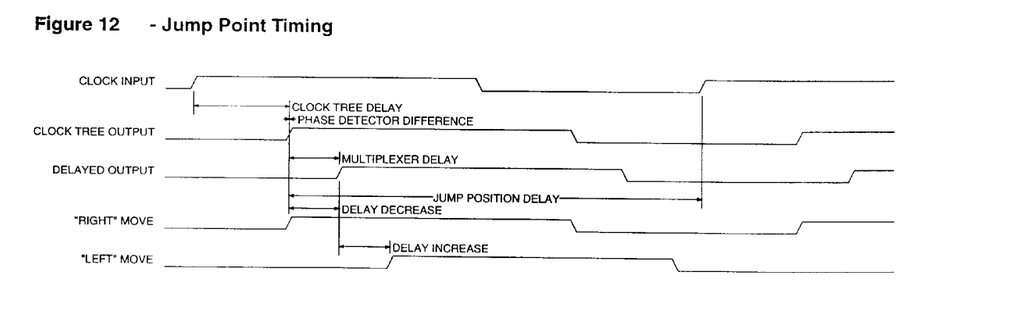
FIG. 12 is a jump point timing diagram for the circuit of FIG. 11.

As the delay increases, the number of multiplexers 64 in the delay path increases. At some point, the phase detector 86 will indicate the input clock has the same phase as the signal traveling past the phase detector 86. The timing diagram in FIG. 12 shows the timing at this point. From the timing diagram, the jump can be made from this point in the delay line to the beginning of the delay line. The control word switches from the 0000 . . . 00001111 . . . 1111 value to a 0000 . . . 00001111 . . . 1110 value to a 0000 . . . 0000 value effectively jumping from one end of the delay line to the other.

By memorizing this point, the jump can be made in reverse. In this case, the control word switches from the 0000 . . . 0000 value to a 0000 . . . 00001111 . . . 1110 to a 0000 . . . 00001111 . . . 1111 value. The problem is finding the jump position when always moving to the right (reducing the delay). However, the phase detector 86 may still be used when the delay line is at the minimum delay point.

In the implementation of the clock and data recovery block, a background process is enabled when the minimum delay point is selected. The background process modifies the control word from the 0000 . . . 0000 value to a 0000 . . .

00001111 . . . 11110 and monitors the phase detector output. This allows the background process to determine the jump point at the same time the delay line is being used. The background process can adjust the control word to 0000 . . . 00011111 . . . 11110 or to 0000 . . . 00000111 . . . 11110 depending on the output of the phase detector 86 compensating for any changes in temperature or voltage. When a jump is required, the background process will have a verified jump point to move to.

However, jumping from one end of the delay line to the other is not perfect. Since the delay through each multiplexer 64 is not guaranteed to evenly divide into one UI of the clock, the jump position may generate a glitch if the wrong position is chosen. By biasing the decision of the phase detector 64, a glitchless jump can be guaranteed with some clock period distortion (shortening of the clock period by more than one delay element). Downstream logic can be designed to handle these variations in the clock period timing.

The multiplexing structure does not need to be implemented by 2 input NAND gates, but can be done by 2-input NOR gates. Custom implementations using pass transistors or tristate logic could be used as long as the delay through the resulting multiplexer is symmetric. As well, the multiplexer 64 could insert additional delay rather than just a multiplexer delay in order to reduce the resolution of the delay line and decrease the total number of delay elements.

Figure 13:
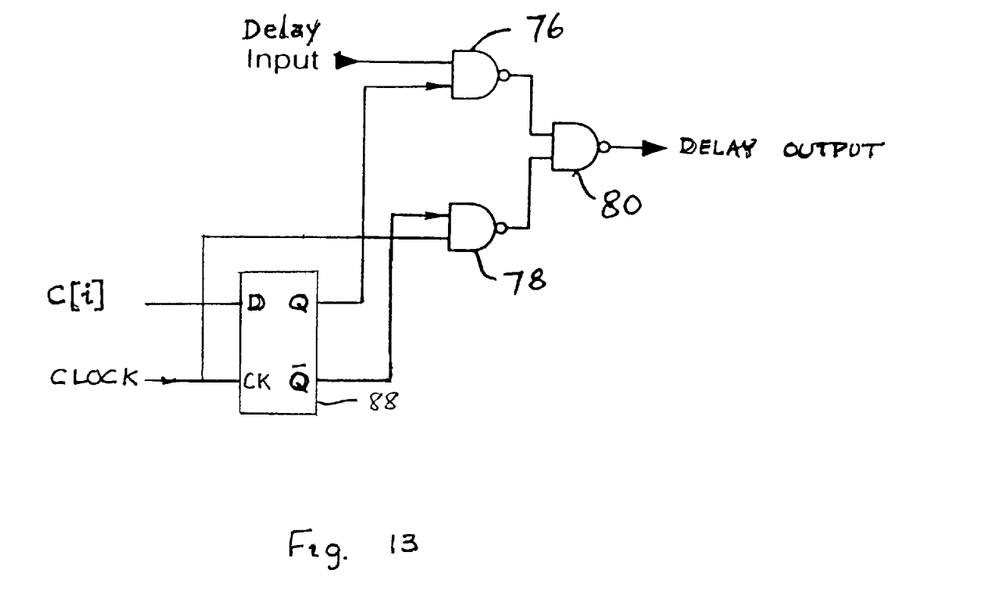
FIG. 13 is a circuit diagram of a multiplexer implemented with a flip-flop replacing two NAND gates.

Referring to FIG. 13, a multiplexer configuration utilizing NAND gates 76, 78, and 80 with a flip-flop 88. This circuit is used only when the flop delay is greater than that of the two NANDS. The NAND gates 76, 78, and 80 acting as inverters ensure layout insensitivity. However, the flop may have enough layout insensitivity that the NAND gates are not required. Other elements could be used to achieve the requisite delays such as gates or buffers.

Figure 14:
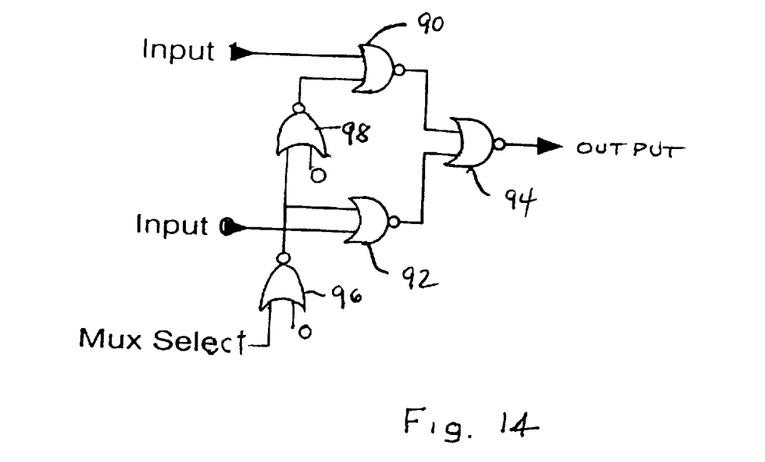
FIG. 14 is a circuit diagram of a multiplexer implemented with NOR gates.

Referring to FIG. 14, NOR gates 90, 92, 94, 96 and 98 are used to form an alternative multiplexer as in FIG. 9.

Figure 15:
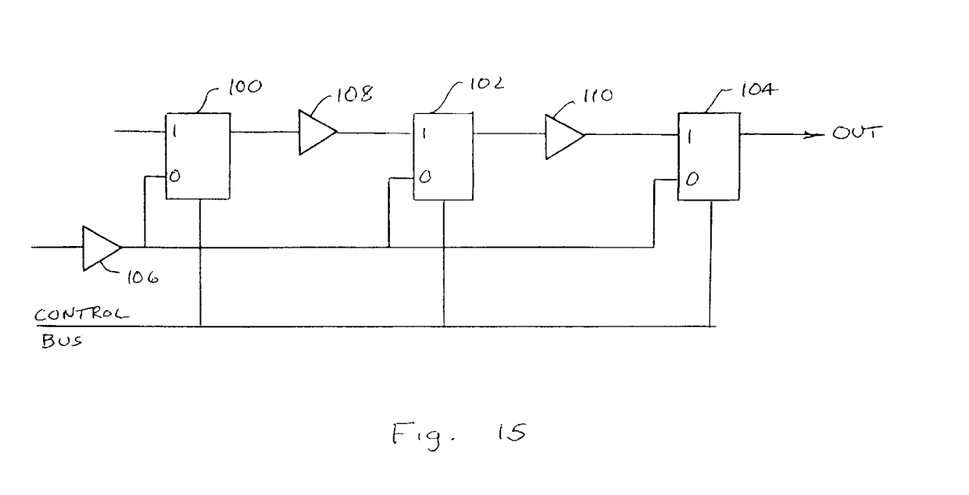
FIG. 15 is a circuit diagram of a delay line with multiplexers and delays.

Referring to FIG. 15, is a delay line with multiplexers 100, 102, and 104 and separate delay elements 108 and 110. A delay tree 106 supplies clock signals to the logic elements and the control bus controls the insertion or deletion of multiplexers 100, 102, and 104. The delay through the multiplexers and delays is symmetric.

Figure 16:
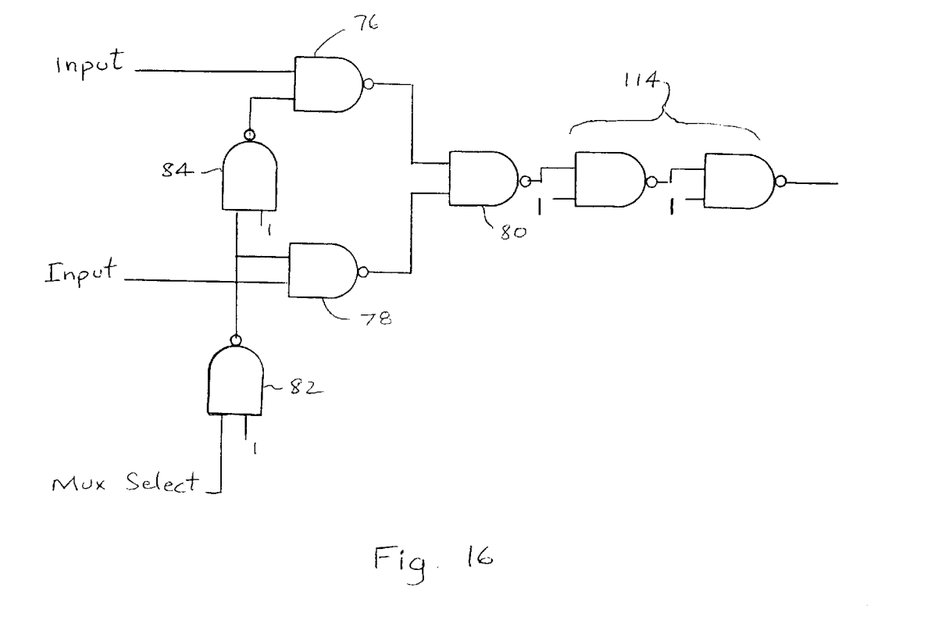
FIG. 16 is a circuit diagram of a delay line with NAND gates used to form a multiplexer as well as delay elements.

Referring to FIG. 16, there is shown a NAND gate implementation of the multiplexer and of the delay elements of FIG. 15 in which the delay element is made of the two NAND gates 114.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

I claim:

1. A method of establishing a digital delay line, comprising:
   (a) forming a sequence of digital delay elements;
   (b) coupling a control bus to each of said delay elements, control signals on said control bus being operative to control the selection or deselection of associated delay elements from proximate a start of said delay line;
   (c) coupling an input clock to each of said digital delay elements by using an input clock bus;
       wherein two or more delay elements are selected or deselected in a single step, proximate an input side of said sequence of delay elements.

2. The method according to claim 1, wherein said digital delay elements is a multiplexer formed from a combination of logic gates.

3. The method according to claim 1, wherein each of said logic gates is selected from the group consisting of a NAND gate and a NOR gate.

4. The method according to claim 2, including interfacing a flip-flop between said control bus and each of said multiplexers.

* * * * *